United States Patent
Chiou et al.

(10) Patent No.: US 10,293,456 B2
(45) Date of Patent: *May 21, 2019

(54) ALIPHATIC POLYURETHANE OPTICAL ENDPOINT DETECTION WINDOWS AND CMP POLISHING PADS CONTAINING THEM

(71) Applicant: Rohm and Haas Electronic Materials CMP Holdings, Inc., Newark, DE (US)

(72) Inventors: Nan-Rong Chiou, Wilmington, DE (US); Mohammad T. Islam, Newark, DE (US); George C. Jacob, Newark, DE (US); Teresa Brugarolas Brufau, Philadelphia, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/910,187

(22) Filed: Mar. 2, 2018

(65) Prior Publication Data

US 2018/0304439 A1    Oct. 25, 2018

Related U.S. Application Data

(63) Continuation-in-part of application No. 15/491,610, filed on Apr. 19, 2017, now Pat. No. 10,207,388.

(51) Int. Cl.
| | |
|---|---|
| *B24B 37/24* | (2012.01) |
| *B24B 37/20* | (2012.01) |
| *H01L 21/66* | (2006.01) |
| *H01L 21/306* | (2006.01) |
| *B24B 37/013* | (2012.01) |

(52) U.S. Cl.
CPC .......... *B24B 37/205* (2013.01); *B24B 37/013* (2013.01); *B24B 37/24* (2013.01); *H01L 21/30625* (2013.01); *H01L 22/26* (2013.01)

(58) Field of Classification Search
CPC ..... B24B 37/013; B24B 37/205; B24B 37/24; H01L 21/30625; H01L 22/26
USPC ................................. 451/527, 533
See application file for complete search history.

(56) References Cited

U.S. PATENT DOCUMENTS

| | | | | |
|---|---|---|---|---|
| 6,984,163 | B2 * | 1/2006 | Roberts | B24B 37/205 451/28 |
| 7,018,581 | B2 * | 3/2006 | David | B24B 37/205 264/235 |
| 2009/0093202 | A1 * | 4/2009 | Fukuda | B24B 37/22 451/533 |
| 2010/0162631 | A1 * | 7/2010 | Sato | B24B 37/205 51/295 |
| 2011/0177758 | A1 * | 7/2011 | Loyack | B24B 37/013 451/6 |
| 2012/0077418 | A1 * | 3/2012 | Loyack | B24B 37/013 451/6 |
| 2012/0100783 | A1 * | 4/2012 | Itoyama | B24B 37/24 451/36 |
| 2013/0273813 | A1 * | 10/2013 | Prasad | B24B 37/24 451/6 |
| 2014/0106652 | A1 * | 4/2014 | Itoyama | C08J 9/12 451/533 |
| 2015/0079879 | A1 * | 3/2015 | Nakamura | B24B 37/013 451/41 |

* cited by examiner

*Primary Examiner* — Eileen P Morgan

(74) *Attorney, Agent, or Firm* — Andrew Merriam; Simon Xu

(57) ABSTRACT

The present invention provides a chemical mechanical (CMP) polishing pad for polishing, for example, a semiconductor substrate, having one or more endpoint detection windows (windows) which at a thickness of 2 mm would have a UV cut-off at a wavelength of 325 nm or lower which are the product of a reaction mixture of (A) from 30 to 56 wt. % of one or more cycloaliphatic diisocyanates or polyisocyanates with (B) from 43 to 69.9999 a polyol mixture of (i) a polymeric diol having an average molecular weight of from 500 to 1,500, such as a polycarbonate diol for hard windows and a polyether polyol for soft windows and (ii) a triol having an average to molecular weight of from 120 to 320 in a weight ratio of (B)(i) polymeric diol to (B)(ii) triol ranging from 1.6:1 to 5.2:1, and a catalyst, preferably a secondary or tertiary amine or bismuth neodecanoate, all weight percent's based on the total solids weight of the reaction mixture.

10 Claims, No Drawings

ALIPHATIC POLYURETHANE OPTICAL ENDPOINT DETECTION WINDOWS AND CMP POLISHING PADS CONTAINING THEM

CROSS-REFERENCE TO RELATED APPLICATIONS

This application is a continuation-in-part of application Ser. No. 15/491,610, filed Apr. 19, 2017.

The present invention relates to a chemical mechanical polishing (CMP polishing) pad with one or more endpoint detection windows. More particularly, the present invention relates to a CMP polishing pad, preferably a polyurethane foam pad, having one or more endpoint detection window which is the product of a reaction mixture of cycloaliphatic polyisocyanate with a polyol mixture of (i) a polymeric diol and (ii) a triol in a weight ratio of from 1.6:1 to 5.2:1 and a catalyst chosen from a tin containing catalyst in the amount of from 0.00001 to 0.1 wt. % or an amine catalyst in the amount of from 0.01 to 1 wt. % or a bismuth containing catalyst in the amount of from 0.00001 to 0.1 wt. %, all weight percent's based on the total solids weight of the reaction mixture.

In the fabrication of integrated circuits and other electronic devices, multiple thin layers of conducting, semiconducting and dielectric materials are deposited on and then at least partially removed from a surface of a semiconductor wafer. As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), has commonly been used to planarize integrated circuits and other electronic device substrates, such as semiconductor wafers, during fabrication. In conventional CMP, a substrate is mounted on a carrier assembly and positioned in contact with a polishing pad in a CMP apparatus. The carrier assembly applies a controlled pressure to the substrate by pressing it against the CMP polishing pad while the pad is moved (e.g., rotated) relative to the substrate by an external driving force. Simultaneously therewith, a polishing medium (e.g., slurry) provided between the wafer and the CMP polishing pad acts to polish and planarize the substrate surface by the chemical and mechanical action of the pad surface and the polishing medium.

One challenge presented in CMP polishing is determining when the substrate has been polished to the desired extent. In situ methods for determining polishing endpoints have been developed. The in situ optical end pointing techniques can be divided into two basic categories: (1) monitoring a reflected optical signal at a single wavelength, such as light from a laser source, or (2) monitoring a reflected optical signal from multiple wavelengths. Typical wavelengths used for optical end pointing include those in the visible spectrum (e.g., 400 to 700 nm), the ultraviolet spectrum (315 to 400 nm), and the infrared spectrum (e.g., 700 to 1000 nm). In monitoring an optical signal, the reflectivity of the substrate changes as the composition at the substrate surface changes from one material to another. This change in reflectivity is then used to detect the CMP polishing endpoint. For example, a spectrometer has been used to acquire an intensity spectrum of reflected light in the visible range of the optical spectrum while using the whole spectrum to detect the polishing endpoint. To accommodate these optical end point measuring techniques, CMP polishing pads have been developed having endpoint detection windows.

Semiconductor devices have become increasingly complex with finer features and more metallization layers. Demand for endpoint detection using light with shorter wavelengths has increased in CMP polishing applications because to facilitate the making of thinner material layers and smaller device sizes in semiconductors. This trend requires improved performance from polishing consumables to maintain planarity and limit polishing defects which can create electrical breaks or shorts in conducting lines and can render the semiconductor device non-functional. However, conventional polymer containing endpoint detection windows often exhibit undesirable degradation upon exposure to light having a wavelength of 330 to 425 nm. Further, known endpoint detection window materials for use in CMP polishing pads have a low transmittance at wavelengths below 400 nm. Accordingly, there remains a need for endpoint detection window materials that have sufficient transmittance at wavelengths below 400 nm and which do not degrade excessively upon exposure to such radiation.

One approach to reduce polishing defects, such as microscratches or chatter marks, is to use a softer polishing layer material to facilitate improved defectivity performance. However, most existing endpoint detection window materials have some aromatic groups in the resin for durability and have a transmittance cut off at too high a radiation wavelength. Further, such conventional window formulations do not pair well with softer polishing layer materials, often leading to an increase in polishing defectivity.

For example, in U.S. Pat. No. 7,927,183, to Fukuda et al. discloses a polishing pad wherein at least a window portion of the CMP polishing pad exhibits a light transmittance of 30% or more in the overall range of wavelengths of 300 to 400 nm. The Fukuda endpoint detection window materials comprise a polyurethane resin having an aromatic ring density of 2 wt. % or less. Such aliphatic isocyanate containing polyurethane materials can provide improved light transmittance over a broad light spectrum. Unfortunately, the aliphatic polyurethane endpoint detection windows disclosed in Fukuda lack the requisite durability required for demanding CMP polishing pad applications.

The present inventors have endeavored to provide durable endpoint detection window materials for use in CMP polishing pads that have an ultraviolet (UV) cut off wavelength of 325 nm or lower.

STATEMENT OF THE INVENTION

1. In accordance with the present invention, chemical mechanical (CMP) polishing pads for polishing a substrate chosen from at least one of a magnetic substrate, an optical substrate and a semiconductor substrate comprise a CMP polishing pad, preferably a polyurethane foam pad, the CMP polishing pad having one or more endpoint detection windows which at a thickness of 2 mm would have a UV cut-off at a wavelength of 325 nm or lower and which are the product of a reaction mixture of (A) from 30 to 56 wt. % of one or more cycloaliphatic diisocyanates or polyisocyanates with (B) from 43 to 69.9999 a polyol mixture of (i) a polymeric diol having an average molecular weight of from 500 to 1,500 and (ii) a triol, such as trimethylol propane (TMP), propoxylated trimethylolpropane having from 1 to 4 propoxy groups or propoxylated glycerol having from 2 to 6 propoxy groups, having an average molecular weight of from 120 to 320 in a weight ratio of (B)(i) polymeric diol to (B)(ii) triol ranging from 1.6:1 to 5.2:1, or, preferably, from 2.5:1 to 5.2:1, and a catalyst chosen from a tin containing catalyst, such as alkyl tin compounds, for example, dibutyltin dilaurate, in the amount of from 0.00001 to 0.1 wt. % or, preferably, an amine catalyst, such as a secondary amine or a tertiary amine, for example, triethylenediamine, in the amount of from 0.01 to 1 wt. %, or, preferably, from 0.05 to 0.5 wt. % or a bismuth containing catalyst, such as bismuth neodecanoate, in the amount of from 0.00001 to 0.1 wt. %, all weight percent's based on the total solids weight of the reaction mixture.

2. In accordance with the chemical mechanical polishing pad of the present invention as in item 1, above, wherein the one or more endpoint detection windows is the reaction product of (B) from 43 to 57.4999 wt. % or, preferably, from 44 to 52.9999 wt. % of the polyol mixture and (A) from 42.5 to 56 wt. % or, preferably, from 47 to 56 wt. % of a cycloaliphatic diisocyanate, such as, 1,4-cyclohexane diisocyanate, 4,4'-dicyclohexylmethane diisocyanate, isophorone diisocyanate, preferably, methylene bis-cyclohexyl isocyanate (4,4'-dicyclohexyl-methane diisocyanate).

3. In accordance with the chemical mechanical polishing pad of the present invention as in any one of items 1 or 2, above, wherein the one or more endpoint detection windows has a Shore D hardness ASTM D2240-15 (2015) of from 40 to 90 or, preferably, from 60 to 85, the (B)(i) polymeric diol is chosen from a polycarbonate diol, such as any of the reaction product of polyester glycols with alkylene carbonates, for example, polycaprolactone polyol with alkylene carbonate; polyester polycarbonate polyols obtained by reacting ethylene carbonate with a diol or glycol and reacting the resulting reaction mixture with an organic dicarboxylic acid, and polycarbonate polyols obtained by ester exchange reaction of a diol or polyether diol compound with alkylene carbonate, and the (B)(ii) triol is trimethylol propane (TMP), propoxylated trimethylolpropane having from 1 to 4 propoxy groups, or propoxylated glycerol having from 2 to 6 propoxy groups, preferably, TMP.

4. In accordance with the chemical mechanical polishing pad of the present invention as in any one of items 1, 2 or 3, above, wherein the one or more endpoint detection windows has a Shore D hardness ASTM D2240-15 (2015) of from 60 to 90 or, preferably, from 64 to 85, and the weight ratio of (B)(i) polymeric diol to (B)(ii) triol ranges from 1.6:1 to 3.5:1 or, preferably, from 2.5:1 to 3.3:1.

5. In accordance with the chemical mechanical polishing pad of the present invention as in any one of items 1, 2, 3 or 4, above, wherein the one or more endpoint detection windows has a Shore D hardness ASTM D2240-15 (2015) of from 60 to 100 or, preferably, from 64 to 90, and a glass transition temperature (Tg) given by a tan delta peak of from 73 to 95° C., or, preferably, from 77 to 92° C.

6. In accordance with the chemical mechanical polishing pad of the present invention as in item 1, above, wherein the one or more endpoint detection windows has a Shore A hardness ASTM D2240-15 (2015) of from 40 to 85 or, preferably, from 50 to 70, the (B)(i) polymeric diol is chosen from a polyether diol, such as a polytetramethylene ether glycol (PTMEG), a polyethylene glycol (PEG), a polypropylene glycol (PPG) or their block copolymers or mixtures, and the triol (B)(ii) is a propoxylated triol, such as one chosen from propoxylated trimethylolpropane having from 1 to 4 propoxy groups or propoxylated glycerol having from 2 to 6 propoxy groups.

7. In accordance with the chemical mechanical polishing pad of the present invention as in any one of items 1 or 6, above, wherein the weight ratio of (B)(i) polymeric diol to (B)(ii) triol ranges from 3.5:1 to 5.2:1 or, preferably, from 3.8:1 to 5:1.

8. In accordance with the chemical mechanical polishing pad of the present invention as in any one of items 1, 6 or 7, above, wherein the one or more endpoint detection windows has a Shore A hardness ASTM D2240-15 (2015) of from 40 to 85 or, preferably, from 50 to 70, and a glass transition temperature (Tg) given by a tan delta peak of from 17 to 32° C., or, preferably, from 18 to 28° C.

9. In accordance with chemical mechanical (CMP) polishing pad of the present invention as set forth in any one of items 1, 6, 7 or 8, above, wherein the one or more endpoint detection windows is the reaction product of (B) from 55 to 69.9999 wt. % or, preferably, from 60 to 69.4999 of the polyol mixture and (A) from 30 to 45 wt. % or, preferably, from 30 to 40 wt. % of a cycloaliphatic diisocyanate, such as, 1,4-cyclohexan diisocyanate, 4,4'-dicyclohexylmethane diisocyanate, isophorone diisocyanate preferably, methylene bis-cyclohexyl isocyanate (4,4'-dicyclohexylmethane diisocyanate).

10. In accordance with the chemical mechanical polishing pad of the present invention as in any one of items 1, 2, 3, 4, 5, 6, 7, 8 or 9, above, wherein the one or more endpoint detection windows is the product of a reaction mixture wherein the mole ratio of isocyanate groups in (A) the cycloaliphatic diisocyanate or polyisocyanate to the number of moles of hydroxyl groups in the (B) polyol mixture ranges from 0.9:1 to 1.10:1 or, preferably, from 0.95:1 to 1.05:1.

11. In accordance with the chemical mechanical polishing pad of the present invention as in any one of items 1, 2, 3, 4, 5, 6, 7, 8, 9 or 10, above, wherein the one or more endpoint detection windows is the product of a reaction mixture that is substantially free of amine curatives.

12. In accordance with the chemical mechanical polishing pad of the present invention as in any one of items 1, 2, 3, 4, 5, 6, 7, 8, 9, 10 or 11, above, wherein the one or more endpoint detection windows having a thickness of 2 mm has a UV cut-off at a wavelength of 325 nm or lower, a % Transmittance (DPT) at a wavelength of 800 nm of from 30% to 85%, a % Transmittance (DPT) delta between a wavelength of 400 nm and of 800 nm less than 20%, and, preferably, having a maximum range in window discoloration (from UV exposure) of 0.1 throughout the range of wavelengths of from 390 to 800 nm.

13. In accordance with the chemical mechanical polishing pad of the present invention as in any one of items 1, 2, 3, 4, 5, 6, 7, 8, 9, 10, 11 or 12, above, wherein the catalyst is a tin containing catalyst in the amount of from 0.00001 to 0.1 wt. % or an amine catalyst in the amount of from 0.01 to 1 wt. % based on the total solids weight of the reaction mixture.

14. In accordance with the chemical mechanical polishing pad of the present invention as in any one of items 1, 2, 3, 4, 5, 6, 7, 8, 9, 10, 11 or 12, above, wherein the catalyst is a bismuth containing catalyst in the amount of from 0.00001 to 0.1 wt. % based on the total solids weight of the reaction mixture.

In another aspect, the present invention provides methods for making endpoint detection window materials for chemical mechanical (CMP) polishing pads having a polishing layer adapted for polishing a substrate comprising providing a reaction mixture as set forth in any one of items 1 to 12 above, combining the components of the reaction mixture, providing a mold having a desired thickness or a desired endpoint detection window length, width or diameter dimension, filling the mold with the reaction mixture, forming a vacuum of from 10 to 95 kPa or, preferably, from 40 to 85 kPa in the mold, and reacting and heat curing the reaction mixture at a temperature of from 50 to 130° C. or, preferably, from 60 to 120° C., for a period of from 12 to 96 hours or, preferably, from 16 to 36 hours where a tin containing catalyst is used or, preferably, from 24 to 56 hours where a tin free catalyst or amine catalyst is used or, preferably, from 12 to 24 hours where a bismuth containing catalyst is used to form a cast polyurethane; and forming an endpoint detection window from the cast polyurethane.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative. Thus, the term "(poly)isocyanate" refers to isocyanate, polyisocyanate, or mixtures thereof.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, unless otherwise indicated, the term "molecular weight" or "average molecular weight" means a formula weight for a given material as reported by its manufacturer. An average molecular weight refers to the molecular weight reported for a distribution of molecules in a given material, e.g. a polymer distribution.

As used herein, the term "stoichiometry" of a reaction mixture refers to the ratio of molar equivalents of NCO groups to the number of molar equivalents of OH groups in a given reaction mixture.

As used herein, the terms G', G", and G"/G' (which corresponds to tan delta, tan δ), respectively, refer, respectively, to shear storage modulus, shear loss modulus, and the loss tangent defined as the ratio of the shear loss modulus (G") to the shear storage modulus (G'). All such values are determined by dynamic mechanical analysis (DMA). Test specimens were cut with 6.3 mm width and 36 mm length. An ARES™ G2 torsional rheometer or a Rheometric Scientific™ RDA3 (both from TA Instruments, New Castle, Del.) were used in accordance with ASTM D5279-13 (2013), "Standard Test Method for Plastics: Dynamic Mechanical Properties: In Torsion." The gap separation was 20 mm. Instrument analysis parameters were set at 100 g of preload, 0.2% strain, oscillation speed of 10 rad/sec, and temperature ramp rate of 3° C./min from −100° C. to 150° C.

As used herein, the term "polyisocyanate" means any isocyanate group containing molecule having three or more isocyanate groups, including blocked isocyanate groups.

As used herein, the term "polyurethanes" refers to polymerization products from difunctional or polyfunctional isocyanates, e.g. polyetherureas, polyisocyanurates, polyurethanes, polyureas, polyurethaneureas, copolymers thereof and mixtures thereof.

As used herein, the term "reaction mixture" includes any non-reactive additives, such as microelements and any additives to lower wet hardness (Shore D or Shore A according to ASTM D2240-15 (2015)) of a polyurethane reaction product in the polishing pad.

As used herein, the term "semiconductor wafer" is intended to encompass a semiconductor substrate, such as an unpatterned semiconductor or one having a pattern, a semiconductor device, various packages for various levels of interconnection, including a single-chip wafer or a multiple-chip wafer, a substrate for a light emitting diode (LED), or other assemblies requiring solder connections.

As used herein, the term "semiconductor substrate" is defined to mean any construction comprising semiconductive material. A semiconductor substrate includes semiconductor devices and any substrate having one or more semiconductor layers or structures which include active or operable portions of semiconductor devices.

As used herein, the term "semiconductor device" refers to a semiconductor substrate upon which at least one microelectronic device has been or is being fabricated.

As used herein, the terms "Shore D hardness" and "Shore A hardness" are the hardness values of a given material as measured after a given time period according to ASTM D2240-15 (2015), "Standard Test Method for Rubber Property—Durometer Hardness". Hardness was measured on a Rex Hybrid hardness tester (Rex Gauge Company, Inc., Buffalo Grove, Ill.), equipped, respectively, with a D or A probe. Four samples were stacked and shuffled for each hardness measurement; and each specimen tested was conditioned by placing it in 50 percent relative humidity for five days at 23° C. before testing and using methodology outlined in ASTM D2240-15 (2015) to improve the repeatability of the hardness tests.

As used herein, the term "SG" or "specific gravity" refers to the weight/volume ratio of a rectangular cut out of a polishing pad or layer in accordance with the present invention.

As used herein, the term "solids" means any material other than water or ammonia that does not volatilize in use conditions, no matter what its physical state. Thus, liquid reactants that do not volatilize in use conditions are considered "solids".

As used herein, the term "substantially free of any amine curative" means that a given composition comprises 2,000 ppm or less, or, preferably, 1,000 ppm of any amine curative compound having primary amine hydrogens.

As used herein, the term "tan delta (tan δ)" means the value G"/G' of a given material, as determined, above, by DMA. A peak value of tan delta (tan δ) corresponds to the Tg or glass transition temperature of a given material.

As used herein, the term "Tg" or "glass transition temperature" of a given material refers to the temperature at which the tan delta of that material peaks in DMA testing.

As used herein, the term "% Transmittance (DPT)" or "double pass transmittance" or "DPT" at a given wavelength as used herein and in the appended claims in reference to an endpoint detection window is determined using the following equation: $DPT = (IW_{Si} - IW_D) \div (IA_{Si} - IA_D)$ wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light through the thickness, Tw, of the window and measuring at the point of origin the intensity of light reflected back through the thickness of the window, Tw, from a surface positioned against a second face of the endpoint detection window substantially parallel to the first face; wherein $IW_{Si}$ is a measurement of the intensity of light that passes through the window from the point of origin and reflects off the surface of a silicon blanket wafer placed against a second face of the window back through the window to the point of origin; wherein $IW_D$ is a measurement of the intensity of light that passes from the point of origin through the window and reflects off the surface of a black body and back through the window to the point of origin; wherein $IA_{Si}$ is a measurement of the intensity of light that passes from the point of origin through a thickness of air equivalent to the thickness, Tw, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light reflected off a black body at the light emitting surface of the 3 mm fiber optic cable.

As used herein, the term "% Transmittance at 400 nm" or "$DPT_{400}$" is the % transmittance exhibited by an endpoint detection window for light having a wavelength of 400 nm.

As used herein, the term "% Transmittance delta between a wavelength of 400 nm and 800 nm" or "$\Delta DPT_{800-400}$" as used herein is the difference in the double pass transmittance exhibited by an endpoint detection window for light having a wavelength of 800 nm and for light having a wavelength of 400 nm determined using the following equation:

$$\Delta DPT_{800-400} = DPT_{800} - DPT_{400}$$

As used herein, the term "polishing medium" and in the appended claims encompasses particle containing polishing solutions and non-particle-containing polishing solutions, such as abrasive free and reactive liquid polishing solutions.

As used herein, the term "UV Cut-off" is defined as wavelength at half-maximum in the step from zero transmission to highest transmission in the range of from 200 nm to 800 nm.

As used herein, the term "window discoloration" is measured from accelerated UV stability measurements. For this measurement, a specific diameter region of a window material set at 6 mm diameter, is exposed to high intensity of UV-A light with peak intensity of 365 nm for a short duration time. The intensity and duration is chosen to correspond to UV exposure of a window during typical pad life. For example, if the intensity of exposed light is 330+/−30 mW/sq. cm (at 365 nm) 45 seconds of exposure corresponds to a typical pad life (6,000,000 flashes of a flashlamp used in CMP polishing). Discoloration is measured from the ratio of window transmission of UV-exposed region of the analyte window to the transmission of an unexposed window.

As used herein, the term "wt. %" stands for weight percent.

In accordance with the present invention, endpoint detection windows from cast polyurethanes made from a reaction mixture of a cycloaliphatic diisocyanate or polyisocyanate and a polyol mixture of a diol and a triol provide high % Transmittance at wavelengths of below 400 nm. The properties of endpoint detection windows of the present invention can be tuned by adjusting the reaction mixture and cure conditions. The reaction mixture enables the formation of endpoint detection windows which are durable enough to find use in a hard chemical mechanical polishing (CMP polishing) pad, such as a pad having a Shore D hardness ASTM D2240-15 (2015) of from 40 to 90. The harder (higher Tg) endpoint detection windows result from cast reaction mixtures of the present invention having more of the cycloaliphatic diisocyanate or polyisocyanate and a polymeric diol containing repeat carbonate groups in the polymer chain. Such reaction mixtures are those as set forth in accordance with any one of items 1-5, and 10-12, above. In addition, the reaction mixture enables the formation of softer (low Tg) endpoint detection windows for soft CMP polishing pads for which Shore A hardness (ASTM D2240-15 (2015) would be a better hardness measure. Softer endpoint detection windows result from cast reaction mixtures of the present invention having less of the cycloaliphatic diisocyanate or polyisocyanate and a polyol mixture comprising a polyether diol. Such reaction mixtures are those as set forth in accordance with any one of items 1, and 6-12, above. A reaction mixture having a propoxylated triol enables the casting of softer (low Tg) endpoint detection windows that retain sufficient durability to remain transparent in CMP polishing. Moreover, the endpoint detection window material of the present invention has a well-defined glass transition temperature (Tg) so that it can be cut, skived or shaped at just above or at that Tg without deforming the endpoint detection window material. By contrast, in the art, the forming of the endpoint detection window by skiving with a hot blade caused recession or bulging of the endpoint detection window indicating a lack of window durability.

The reaction mixtures of the present invention are free or substantially free (less than 10,000 ppm, based on the total solids weight of the reaction mixture) of aromatic diisocyanates or polyisocyanates. Aromatic diisocyanates or polyisocyanates impair the % Transmittance of polyurethanes made therefrom at wavelengths of 400 nm or less.

The reaction mixtures of the present invention contain polymeric diols which enable endpoint detection windows made therefrom to have sufficient durability that they do not buckle or bulge from the CMP polishing pad during processing. The reaction mixtures of the present invention also provide a tin-free catalyst, such as a secondary or tertiary amine without compromising the durability or quality of the endpoint detection windows made therewith. Such amine catalysts more preferably have at least two amine groups and are aliphatic.

In the reaction mixtures for making harder endpoint detection windows, as set forth in accordance with any one of items 1-5, and 10-12, above, the polymeric diol (B)(i) comprises polycarbonate diols having a molecular weight of from 500 to 1,000, or preferably, from 500 to 800. The polycarbonate diols (B)(i) having such relatively lower molecular weights help to insure the hardness of endpoint detection windows therefrom, thereby enabling the provision of hard CMP polishing pads having a Shore D hardness ASTM D2240-15 (2015) of from 40 to 90 with endpoint detection windows that do not bulge or buckle from the surface thereof during or after processing.

In the reaction mixtures for making softer endpoint detection windows, as set forth in accordance with any one of items 1 and 6-12, above, the polymeric diol (B)(i) comprises polyether diols having a molecular weight of from 800 to 1,500, or preferably, from 900 to 1,250. The polyether diols (B)(i) having such relatively higher molecular weights help to insure the softness of endpoint detection windows therefrom, thereby enabling the provision of soft CMP polishing pads having a Shore A hardness (ASTM D2240-15) of from 40 to 80 with endpoint detection windows that do not bulge or buckle from the surface thereof during or after processing.

The endpoint detection window of the present invention may itself be a rod or plug of transparent cast polyurethane in a molded CMP polishing pad. The rod or plug may be inserted and molded within the CMP polishing pad (i.e., an "integral window"), or, in the case of soft or low Tg endpoint detection windows may be installed into a cut out in the polishing pad after the molding operation (i.e., a "plug in place window"). Accordingly, the hard endpoint detection window of the present invention is preferably, made by an integral window method, while the soft endpoint detection window of the present invention may be made as an integral window or by plug in place.

In accordance with the present invention, forming hard (≥40 Shore D) or soft (≤85 Shore A) endpoint detection windows by integral window methods comprises: Providing a molded cast polyurethane rod (cylinder) or rectangular block made from a reaction mixture in accordance with the present invention as in any one of items 1 to 12, above, and having a desired endpoint detection window length and width dimension or diameter dimension; providing a curable or shapeable polymer mixture for making a CMP polishing pad, such as a polyurethane prepolymer and an amine curative; providing a mold for a CMP polishing pad cake (cake mold); filling the cake mold with the curable or shapeable polymer mixture; inserting one or more cast polyurethane rods or cylinders or blocks into the filled cake mold so they are oriented normal to the top or bottom of the cake; casting to form a cake and removing it from the cake mold; and skiving the cake in a direction perpendicular to the orientation of the cylinder or rod of the cast polyurethane to a desired CMP polishing pad thickness. In accordance with the present invention, skiving takes place at or near the Tg of the endpoint detection window material.

The present invention provides a method of making a CMP polishing pad according to the present invention, comprising: providing a CMP polishing layer having a polishing surface; separately, forming an endpoint detection window from the reaction mixture of the present invention as in any one of items 1 to 12, above; interfacing the endpoint detection window with the polishing layer to provide a chemical mechanical polishing pad; wherein the endpoint detection window is an integral or a plug in place window or is a window molded to achieve its desired dimensions.

Preferably, to form plug in place (PIP) soft (low Tg) endpoint detection windows, the forming of an endpoint detection window can comprise: providing a reaction mixture in accordance with the present invention; molding which can be any of (i) molding the reaction mixture of the present invention and subsequently skiving the resulting molded article to get a desired thickness of from 0.5 to 3.0 mm, or preferably, 0.5 to 2.0 mm; (ii) molding to a desired thickness of from 0.5 to 3.0 mm, or preferably, 0.5 to 2.0 mm and a desired outline; or, (iii) molding to a desired thickness of from 0.5 to 3.0 mm, or preferably, 0.5 to 2.0 mm and stamping or punching the cast polyurethane to a desired outline shape to form each endpoint detection window; separately, molding a suitable polymeric material to form a CMP polishing pad, such as a polyisocyanate prepolymer and an aromatic diamine, to form a polymeric, such as a polyurethane, CMP polishing pad of the present invention; cutting or forming a recessed area, aperture or opening in the CMP polishing pad that is the same size or slightly larger than the outline of the endpoint detection window; and, incorporating the endpoint detection window in the recessed area or opening in the CMP polishing pad.

A hard window can be formed by a PIP method so long as the window material is heated to a sufficient temperature, for example, at or above its Tg, to enable stamping or punching the window material as a cast mold having a desired thickness of 0.5 to 3.0 mm, or preferably, 0.5 to 2.0 mm.

Generally, in casting to form the endpoint detection windows of the present invention, a vacuum is applied to the reaction mixture before the molding step to remove or prevent the formation of pores or bubbles.

The chemical mechanical polishing pads of the present invention may further comprise at least one additional layer interfaced with the polishing layer, such as a sub pad. The additional layer can have a slightly smaller opening or aperture than the polishing layer of the CMP polishing pad which is concentric with or having the same center point as the hole, aperture or opening in the polishing layer so as to enable optical detection while providing a shelf that the endpoint detection window can rest upon and interface with. Preferably, the polishing layer is interfaced with the at least one additional layer using an adhesive. The adhesive can be selected from pressure sensitive adhesives, hot melt adhesives, contact adhesives and combinations thereof. Preferably, the adhesive is a hot melt adhesive or a pressure sensitive adhesive. More preferably, the adhesive is a hot melt adhesive.

In accordance with the present invention, methods of polishing a substrate, comprise: Providing a substrate selected from at least one of a magnetic substrate, an optical substrate and a semiconductor substrate; providing a chemical mechanical (CMP) polishing pad having an endpoint detection window as in any one of items 1 to 12, above; creating dynamic contact between a polishing surface of the polishing layer of the CMP polishing pad and the substrate to polish a surface of the substrate; and, conditioning of the polishing surface of the polishing pad with an abrasive conditioner.

More particularly, the present invention provides a method of polishing a substrate, comprising: providing a chemical mechanical polishing apparatus having a platen, a light source and a photosensor; providing at least one substrate; providing a chemical mechanical polishing pad as in any one of items 1 to 12, above; installing onto the platen the chemical mechanical polishing pad; optionally, providing a polishing medium at an interface between the polishing surface and the substrate; creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor.

In accordance with the present invention, methods of using the endpoint detection windows is specifically a method of detecting the end-point of polishing by irradiating a substrate via a CMP polishing pad through the endpoint detection window, with a light beam, and monitoring an interference signal generated by reflection of the light beam. As the light beam, for example, a white LED or white light using a halogen or deuterium lamp having a light of wavelengths of from 300 to 800 nm is generally used. In such methods, the end-point is determined by knowing an approximate depth of surface unevenness through monitoring of a change in the thickness of a surface layer of a wafer. When such change in thickness becomes equal to the thickness of the unevenness, the CMP process is finished. Accordingly, one determines a CMP polishing endpoint by transmitting light from the light source through the endpoint detection window and analyzing the light reflected off the surface of the substrate back through the endpoint detection window incident upon the photosensor. As a method of detecting the end-point of polishing by such optical means and a polishing pad used in the method, various methods and polishing pads have been proposed.

During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection.

The polishing layer of the chemical mechanical polishing pad of the present invention has a polishing surface adapted for polishing a substrate. Preferably, the polishing surface is adapted for polishing a substrate selected from at least one of a magnetic substrate, an optical substrate and a semiconductor substrate. More preferably, the polishing surface is adapted for polishing a semiconductor substrate.

The polishing layer of the chemical mechanical polishing pad of the present invention is preferably made of a polymeric material comprising a polymer selected from polycarbonates, polysulfones, nylons, polyethers, polyesters, polystyrenes, acrylic polymers, polymethyl methacrylates, polyvinylchlorides, polyvinylfluorides, polyethylenes, polypropylenes, polybutadienes, polyethylene imines, polyurethanes, polyether sulfones, polyamides, polyether imides, polyketones, epoxies, silicones, EPDM, and combinations thereof. Preferably, the polishing layer comprises a polyurethane. One of ordinary skill in the art will understand to select a polishing layer having a thickness suitable for use in a chemical mechanical polishing pad for a given polishing operation. Preferably, the polishing layer exhibits an average thickness of 20 to 150 mils (more preferably 30 to 125 mils; most preferably 40 to 120 mils).

Preferably, the polishing surface has macrotexture selected from at least one of perforations and grooves. Perforations can extend from the polishing surface part way or all the way through the thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, polishing layer of the chemical mechanical polishing pad of the present invention has a polishing surface adapted for polishing the substrate, wherein the polishing surface has a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

The present invention will now be illustrated in detail in the following non-limiting Examples:

In the following Examples, unless otherwise stated, all pressures are standard pressure (101 kPa) and all temperatures are ambient or room temperature (~22-23° C.). The following raw materials were used in the Examples:

H12MDI: Methylene bis (4-cyclohexylisocyanate), a.k.a. dicylohexylmethane-4,4'-diisocyanate;

Diol 1: Linear, hydroxyl-terminated, aliphatic polycarbonate diol with an average molecular weight of approx. 650 g/mol, sold as Desmophen™ C XP 2716 Covestro AG, Leverkusen, Germany;

Diol 2: polyether diol is produced by reacting propylene glycol with propylene oxide where propylene glycol acts as the initiator, 1,000 MW (average molecular weight); (sold as Voranol™ 220-110, Dow Polyurethanes, The Dow Chemical Company, Midland, Mich. (Dow));

Triol 1: Trimethylol propane or TMP, MW (molecular weight): 134.17 g/mol;

Triol 2: Propoxylated trimethylolpropane, 255 MW (average molecular weight); average number of propoxy groups on each hydroxyl group, n=1, sold as Voranol™ 230-660, Dow Polyurethanes, Dow);

Catalyst 1: Dabco™ T12 Dibutyltin dilaurate catalyst, MW (molecular weight): 631.56 (Air Products and Chemicals, Inc., Allentown, Pa.);

Catalyst 2: Triethylenediamine, MW (molecular weight)-112.17 (Dabco™ 33LV Air Products and Chemicals, Inc., Allentown, Pa.);

Catalyst 3: Bismuth necodecanoate, MW (molecular weight)-722.75 (Sigma Aldrich, Saint Louis, Mo.);

Polyisocyanate Prepolymer: Adiprene™ LW 570 polyether-containing polyisocyanate polymer, was prepared with an aliphatic diisocyanate with available isocyanate content (% NCO) of 7.35-7.65 wt. % (Chemtura Corporation, Middlebury, Conn.);

Curative: Ethacure™ 100 amine curing agent is an 3,5-diethyltoluene-diamine (Albemarle, Ltd., Baton Rouge, La.); and Light Stabilizer: Univul™ 3039 is a cyanoacrylicacid ethylhexyl ester (BASF Corporation, Florham Park, N.J.).

EXAMPLES 1 TO 5, 7 AND COMPARATIVE EXAMPLE 6: FORMATION OF CMP POLISHING PADS WITH ENDPOINT DETECTION WINDOWS

Endpoint detection windows were formed from the reaction mixture formulations indicated in Table 1A, below.

Integral Windows (IW): Reaction mixtures for hard endpoint detection windows (indicated as IW in Tables 2 and 3, below), and some soft endpoint detection windows (indicated as "IW" in Table 2, below) were cast in cylindrical or rectangular block molds having the dimensions and under the molding conditions indicated in Examples 1 to 5, 7 and Comparative Example 6, below. The resulting cast cylinders or blocks were inserted in a cake mold normal to its bottom and top surface. Then a pad forming mixture of a polyisocyanate prepolymer and aromatic diamine curative below, was poured into the cake mold to form the indicated CMP polishing pad at the indicated time and temperature, as indicated in Table 1B, below. The resulting pads were then skived with a stainless steel blade at the indicated temperature to a thickness of 2 mm.

PIP (Plug in Place Windows): Reaction mixtures for some endpoint detection windows, were under the molding conditions indicated in Examples 1 to 5, 7 and Comparative Example 6, below, forming a molding and subsequently skiving the molding to get a desired thickness of 2.0 mm, as indicated by "skived" in Table 2, below. Separately, a pad forming mixture of a polyisocyanate prepolymer and aromatic diamine and polyol curatives, would have been molded in a cake mold and skived to form the indicated CMP polishing pad having a 2 mm thickness at the time and temperature as indicated in Table 1B, below. Then the CMP polishing pads would have been stamped to form an aperture, hole or opening of the desired endpoint detection window dimension, followed by inserting and adhering the endpoint detection window therein.

Molded Windows: Reaction mixtures for some windows indicated in Examples 1 to 5, 7 and Comparative Example 6, below, were cast directly into a desired disk shape having a thickness of 2 mm under the conditions indicated in Examples 1 to 5, 7 and Comparative Example 6, below. Molded disks are indicated in Table 2, below, as "Disk".

The indicated number of endpoint detection windows were evaluated and tested for Tan Delta and Tg (Average peak Tan Delta), as shown in Table 1A, below. The indicated average UV cut-off, % Transmittance and change in % Transmittance from 400 nm to 800 nm for each window or window containing pad tested, including the number of trials, are shown in Table 2, below. In addition, CMP polishing pads having endpoint detection windows were evaluated for buckle/bulge and the average results, including the number of trials are indicated in Table 3, below, by endpoint detection window, CMP polishing pad and number of trials for each.

Example 1: Hard Endpoint Detection Window or Hard Pad Having a Hard Endpoint Detection Window Hard CMP polishing pads indicated in Table 1B, below, having the hardness indicated in Table 1B, below, were formed having three endpoint detection windows with a Shore D Hardness (2 s) of ~80. The endpoint detection windows of Example 1 were cast from the reaction mixture indicated in Table 1A, below, in a right cylindrical mold having a diameter of 12 mm at 65° C. for 12 hours and then 110° C. for 12 hours, as indicated in Table 2, below as "IW" or, was cast directly as a disk having a thickness of 2 mm, as indicated in Table 2, below, as "Disk". If cast as a block or cylinder, the molding was then inserted into a CMP polishing pad forming mixture for the CMP polishing pad and then cast to form the indicated CMP polishing pad having the Shore D hardness (2 s) indicated in Table 1B, below, by IW methods. The resulting pad was then skived with a stainless steel blade at a temperature range of 75 to 90° C. to a thickness of 2 mm.

Example 2: Hard Endpoint Detection Window or Hard Pad Having a Hard Endpoint Detection Window Example 1 was repeated except that the CMP polishing pads indicated in Table 1B were formed having three endpoint detection windows with a Shore D Hardness (2 s) of ~79. The endpoint detection window was cast from the reaction mixture indicated in Table 1A, below, in a right cylindrical mold having a diameter of 18 mm at 80° C. for 16 hours and then 110° C. for 12 hours or, as indicated in Table 2 or 3, below as "IW" or "skived", or was cast directly as a disk having a thickness of 2 mm, as indicated in Table 2, below, as "Disk". If cast as a block or cylinder, the molding was then inserted into a CMP polishing pad forming mixture for a CMP polishing pad and then cast to form the indicated CMP polishing pad having the Shore D hardness (2 s) indicated in Table 1B, below, by IW methods. Skiving temperature was in the range of 75–90° C.

Example 3: Soft Endpoint Detection Window or Soft Pad Having a Soft Endpoint Detection Window Example 1 was repeated except that the CMP polishing pads indicated in Table 1B, below, were replaced by soft pads formed having endpoint detection windows with the indicated Shore A Hardness as in Table 1A, below. The endpoint detection windows with a Shore A Hardness (15 s) of 56 were cast or molded from the reaction mixture indicated in Table 1A, below, at 65° C. for 12 hours and then 110° C. for 12 hours to form a cake or, were cast directly as a disk having a thickness of 2 mm, as indicated in Table 2, below, as "Disk". Where skived as indicated in Tables 2 or 3 as "IW", below, a cast cake was skived (at temperature range of 20 to 35° C.) to form sheets of a 2 mm thickness to form the windows.

Example 4: Soft Endpoint Detection Window or Soft Pad Having a Soft Endpoint Detection Window The endpoint detection window with Shore A Hardness (2 s) of 55 was cast or molded from the reaction mixture indicated in Table 1A, below, at 110° C. for 48 hours to form a cake or, were cast directly as a disk having a thickness of 2 mm, as indicated in Table 2, below, as "Disk". Where skived as indicated in Table 2, below, a cast cake was skived (at temperature range of 20 to 35° C.) to form sheets of a 2 mm thickness to form the windows.

Example 5: Hard Endpoint Detection Window or Hard Pad Having a Hard Endpoint Detection Window Example 1 was repeated except that the CMP polishing pads indicated in Table 1B, below, were formed having three endpoint detection windows with a Shore D Hardness indicated in Table 1A, below. If skived as indicated in Table 2, below, or for use in IW pads in Table 3, below, the endpoint detection window was cast from the reaction mixture indicated in Table 1A, below, in a right cylindrical mold having a diameter of 12 mm at 50° C. for 12 hours and then 110° C. for 12 hours. Skiving temperature was in the range of 75-90° C. The reaction mixture was cast directly as a disk having a thickness of 2 mm, if indicated in Table 2, below, as "Disk".

Comparative Example 6: Hard Endpoint Detection Window or Hard Pad Having a Hard Endpoint Detection Window Example 1 was repeated except that the CMP polishing pads indicated in Table 1B, below, were formed having three endpoint detection windows with a Shore D Hardness (2 s) of ~66. The endpoint detection window was cast from the reaction mixture indicated in Table 1A, below, and was cast for "IW" in a right cylindrical mold having a diameter of 12 mm at 95° C. for 22 hours (see Tables 2 and 3, below). Skiving temperature was in the range of 75-90° C. If molded directly into a 2 mm thick disk, the resulting window is indicated as "Disk" in Table 2, below.

Example 7: Hard Endpoint Detection Window or Hard Pad Having a Hard Endpoint Detection Window Example 1 was repeated except that the CMP polishing pads indicated in Table 1B were formed having three endpoint detection windows with a Shore D Hardness (2 s) of ~78. The endpoint detection window was cast from the reaction mixture indicated in Table 1A, below, in a right cylindrical mold having a diameter of 18 mm at 80° C. for 2 hours and then 110° C. for 12 hours or, as indicated in Table 2 or 3, below as "IW" or "skived". If cast as a block or cylinder, the molding was then inserted into a CMP polishing pad forming mixture for a CMP polishing pad and then cast to form the indicated CMP polishing pads having the Shore D hardness (2 s) indicated in Table 1B, below, by IW methods. Skiving temperature was in the range of 75-90° C.

TABLE 1A

Endpoint Detection Window Reaction Mixtures

| Reaction Mixture | 1 | 2 | 3 | 4 (wt.%) | 5 | 6* | 7 |
|---|---|---|---|---|---|---|---|
| H12MDI | 51.22 | 51.17 | 33.97 | 33.87 | 46.28 | | 48.40 |
| Diol 1 | 36.92 | 36.89 | | | 33.36 | | 41.30 |
| Diol 2 | | | 52.82 | 52.66 | | | |
| Triol 1 | 11.86 | 11.84 | | | | | 10.30 |
| Triol 2 | | | 13.20 | 13.17 | 20.36 | | |
| Catalyst 1 | 0.0011 | | 0.01 | | 0.001 | | |
| Catalyst 2 | | 0.10 | | 0.30 | | | |
| Catalyst 3 | | | | | | | 0.002 |
| Curative | | | | | | 11 | |
| Light Stabilizer | | | | | | 1 | |
| Poly-isocyanate Prepolymer | | | | | | 88 | |
| Avg Tg ° C. (DMA) | 93.7 | 83.2 | 19.9 | 21.7 | 75.2 | 57.0 | 78.2 |
| Shore D Hardness (2 s) | 79.9 | 79.1 | | | 76.0 | 66.0 | 77.8 |
| Shore D Hardness (15 s) | 78.7 | 77.9 | | | 74.6 | 63.5 | 76.1 |
| Shore A Hardness (2 s) | | | 62.6 | 55.4 | | | |
| Shore A Hardness (15 s) | | | 56.1 | 49.3 | | | |
| # of trials | 6 | 6 | 6 | 6 | 6 | 6 | 6 |

*—Denotes Comparative Example.

TABLE 1B

CMP Polishing Pads
All CMP polishing pads indicated in Table 1B, below, were polyurethane foam pads formed from a polyisocyanate prepolymer and a diamine curative.

| CMP Polishing Pad | Shore D Hardness (2 s) | Molding time and temperature | Soft or Hard |
|---|---|---|---|
| A | 65 | Ramp to 105° C. and hold for 15.5 hours | Hard |
| B | 60 | Same | Hard |
| C | 54 | Same | Hard |

TABLE 2

Various %Transmittance Properties of Endpoint Detection Windows

| Example | Pad ID and # trials | Window or Interface Method | Avg. UV Cut-off (wavelength nm) | Avg. % Transmittance @ 800 nm | Avg. Delta % Transmittance** |
|---|---|---|---|---|---|
| 6* | A-6 | Skived (IW) | 395 | 50% | 19% |
| 5 | n/a-3 | Disk | 291 | 79% | 2.1% |
| 5 | A-6 | Skived (IW) | 292 | 33% | 3.9% |
| 3 | n/a-3 | Disk | 295 | 80% | 2.4% |
| 3 | n/a-6 | Skived (for PIP) | 297 | 51% | 7.0% |
| 1 | n/a-3 | Disk | 290 | 80% | 1.9% |
| 1 | A-6 | Skived (IW) | 291 | 22% | 3.8% |
| 2 | n/a-3 | Disk | 290 | 82% | 2.1 |
| 2 | A-6 | Skived (IW) | 291 | 38% | 4.2% |
| 4 | n/a-3 | Disk | 297 | 79% | 2.5% |
| 4 | n/a-6 | Skived (for PIP) | 298 | 48% | 3.8% |
| 7 | C-6 | Skived (IW) | 296 | 34% | 4.8% |

*Denotes Comparative Example;
**change in % Transmittance from 400 nm to 800 nm.

As shown in Table 2, above, all of the inventive endpoint detection windows gave dramatically lower average UV cut-off wavelengths, even where the windows were incorporated into a CMP polishing pad. All of the inventive endpoint detection windows also gave excellent low average deltas in % Transmittance over the range of 400 nm to 800 nm wavelengths. The molded endpoint detection windows or disks gave the best overall performance. The only Example of an inventive endpoint detection window having any less than excellent light transmission performance overall was the Example 1 hard window that was skived and placed in a hard CMP polishing pad, A, wherein the skiving caused texture to result in the window surface. This suggests that such skiving could have taken place at a slightly (10-15° C.) higher temperature to avoid creating window surface texture.

Bulge-Recess Measurements were performed using a mechanical profilometer planarity measurement tool having an uncertainty of ±0.00125 mm. The thickness gauge measures the level of the polishing layer at the edge of window in each of four equally spaced points surrounding the perimeter or circumference of the window. The window surface in the Examples lies flush with the surface of the polishing layer of the CMP polishing pad. So, the profilometer measures the protrusion or recess at the center of the window with respect to the level of adjacent pad surface. A positive value indicates bulge or protrusion and the negative value indicates recess. An acceptable result is a bulge or recess of 0.05 mm or less. The results are presented in Table 3, below.

TABLE 3

Various % Transmittance Properties of Endpoint Detection Windows for skived (integral windows)

| Example | Pad/Method | # of trials | Average Bulge/Recess[1] (mm) |
|---------|------------|-------------|-------------------------------|
| 1       | A/IW       | 113         | −0.0442                       |
| 1       | B/IW       | 159         | −0.0315                       |
| 1       | C/IW       | 24          | 0.0081                        |
| 2       | A/IW       | 72          | −0.027                        |
| 5       | A/IW       | 222         | 0.0925                        |
| 6*      | A/IW       | 981         | −0.0429                       |
| 6*      | B/IW       | 375         | −0.0023                       |
| 6*      | C/IW       | 219         | −0.0067                       |
| 7       | C/IW       | 80          | −0.025                        |

*Denotes Comparative Example;
[1]Recess indicated as a negative number.

As shown in Table 3, above, the inventive endpoint detection windows all withstood skiving and gave acceptable bulge/buckle results except Example 5 which would likely perform better if skived at a lower temperature of about 70 to 80° C. The endpoint detection windows of Example 1 are the hardest and therefore require the highest skiving temperature. The Comparative Example 6 windows gave acceptable bulge/recess results even though their optical properties were not acceptable.

We claim:

1. A chemical mechanical (CMP) polishing pad for polishing a substrate chosen from at least one of a magnetic substrate, an optical substrate and a semiconductor substrate, the CMP polishing pad comprising one or more endpoint detection windows, the one or more endpoint detection windows being a polyurethane, the polyurethane has a UV cut-off at a wavelength of 325 nm or lower, and is a product of a reaction mixture of (A) from 30 to 56 wt. % of one or more cycloaliphatic diisocyanates or polyisocyanates with (B) from 43 to 69.9999 wt. % of a polyol mixture of (i) a polymeric diol having an average molecular weight of from 500 to 1,500 and (ii) a triol having an average molecular weight of from 120 to 320 in a weight ratio of (B)(i) polymeric diol to (B)(ii) triol ranging from 1.6:1 to 5.2:1, and (C) a catalyst chosen from a tin containing catalyst in the amount of from 0.00001 to 0.1 wt. % or an aliphatic amine catalyst in the amount of from 0.01 to 1 wt. % or a bismuth containing catalyst in the amount of from 0.00001 to 0.1 wt. %, all weight percent's based on the total solids weight of the reaction mixture, for reacting the reaction mixture of (A) and (B).

2. The chemical mechanical (CMP) polishing pad as claimed in claim 1, wherein the polyurethane is the reaction product of (B) from 43 to 57.4999 wt. % of the polyol mixture and (A) from 42.5 to 55 wt. % of a cycloaliphatic diisocyanate.

3. The chemical mechanical (CMP) polishing pad as claimed in claim 1, wherein the one or more endpoint detection windows has a Shore D hardness ASTM D2240-15 (2015) of from 40 to 90, the (B)(i) polymeric diol is chosen from a polycarbonate diol, and the (B)(ii) triol is trimethylol propane (TMP) or a propoxylated trimethylolpropane having from 1 to 4 propoxy groups.

4. The chemical mechanical (CMP) polishing pad as claimed in claim 1, wherein the one or more endpoint detection windows has a Shore D hardness ASTM D2240-15 (2015) of from 60 to 90, and the weight ratio of (B)(i) polymeric diol to (B)(ii) triol ranges from 1.6:1 to 3.5:1.

5. The chemical mechanical (CMP) polishing pad as claimed in claim 1, wherein the one or more endpoint detection windows has a Shore D hardness ASTM D2240-15 (2015) of from 60 to 100, and a glass transition temperature (Tg) given by tan delta peak of from 73 to 95° C.

6. The chemical mechanical (CMP) polishing pad as claimed in claim 1, wherein the one or more endpoint detection windows has a Shore A hardness ASTM D2240-15 (2015) of from 40 to 80, the (B)(i) polymeric diol is chosen from a polyether diol, and the triol (B)(ii) is a propoxylated triol.

7. The chemical mechanical (CMP) polishing pad as claimed in claim 1, wherein the polyurethane is the product of a reaction mixture wherein the mole ratio of the number of moles of isocyanate groups in (A) the cycloaliphatic diisocyanate or polyisocyanate to the number of moles of hydroxyl groups in the (B) polyol mixture ranges from 0.9:1 to 1.10:1.

8. The chemical mechanical (CMP) polishing pad as claimed in claim 1, wherein the polyurethane is the product of a reaction mixture that is substantially free of amine curatives, and the catalyst is an aliphatic tertiary amine catalyst.

9. The chemical mechanical (CMP) polishing pad as claimed in claim 1, wherein the catalyst is a tin containing catalyst in the amount of from 0.00001 to 0.1 wt. % or an amine catalyst in the amount of from 0.01 to 1 wt. %, all weight percent's based on the total solids weight of the reaction mixture.

10. The chemical mechanical (CMP) polishing pad as claimed in claim 1, wherein the catalyst is a bismuth containing catalyst in the amount of from 0.00001 to 0.1 wt. %, based on the total solids weight of the reaction mixture.

* * * * *